United States Patent
Jin et al.

(10) Patent No.: US 10,474,553 B2
(45) Date of Patent: Nov. 12, 2019

(54) BUILT-IN SELF TEST FOR A/D CONVERTER

(71) Applicant: NXP USA, Inc., Austin, TX (US)

(72) Inventors: Xiankun Jin, Austin, TX (US); Mark Stachew, Austin, TX (US)

(73) Assignee: NXP USA, Inc., Austin, TX (US)

( * ) Notice: Subject to any disclaimer, the term of this patent is extended or adjusted under 35 U.S.C. 154(b) by 196 days.

(21) Appl. No.: 15/652,309

(22) Filed: Jul. 18, 2017

(65) Prior Publication Data

US 2019/0026205 A1  Jan. 24, 2019

(51) Int. Cl.
*G06F 11/00* (2006.01)
*G06F 11/27* (2006.01)

(52) U.S. Cl.
CPC ................... *G06F 11/27* (2013.01)

(58) Field of Classification Search
CPC .... G06F 11/27; G06F 11/2284; H03M 1/108; H03M 1/12
See application file for complete search history.

(56) References Cited

U.S. PATENT DOCUMENTS

| | | | | |
|---|---|---|---|---|
| 5,909,186 A * | 6/1999 | Gohringer | ........... | H03M 1/1071 341/120 |
| 6,557,131 B1 * | 4/2003 | Arabi | ..................... | H03M 1/109 714/733 |
| 6,658,368 B2 * | 12/2003 | Wagner | .............. | G01R 31/3167 341/120 |
| 7,039,540 B1 * | 5/2006 | Dahle | ................. | H03M 1/1071 341/120 |
| 7,271,751 B2 * | 9/2007 | Peterson | ............. | H03M 1/1071 324/750.3 |
| 7,633,416 B2 * | 12/2009 | Horisaki | ............... | H03M 1/108 341/120 |
| 7,994,953 B2 * | 8/2011 | Christ | ................... | H03M 1/109 341/120 |
| 8,099,252 B2 * | 1/2012 | Warren | .................. | G01R 31/40 702/108 |
| 8,400,180 B2 * | 3/2013 | Roberts | ............. | G01R 31/2893 324/756.02 |
| 8,510,073 B2 * | 8/2013 | Dasnurkar | ........... | H03M 1/109 702/117 |
| 8,866,650 B2 * | 10/2014 | Spinks | .................. | H03M 1/109 323/234 |
| 9,726,724 B2 * | 8/2017 | Xu | ...................... | G01R 31/2886 |
| 2003/0220758 A1 * | 11/2003 | Nishimura | ............ | H03M 1/109 702/117 |

(Continued)

OTHER PUBLICATIONS

European search report—EP 3432474 A1 (Year: 2018).*

(Continued)

*Primary Examiner* — Elmira Mehrmanesh (57) ABSTRACT

Analog-to-digital conversion is tested in-field using an on-chip built-in self-test (BIST) sub-circuit formed within an underlying integrated circuit. Processing cycles may be conscripted during an idle state when the analog-to-digital conversion is not needed. The BIST requires a test time which may be compared to an idle time. If the idle time exceeds the test time, then the BIST may be entirely performed. However, if the idle time is unknown or less than the test time, the BIST may be paused and resumed between subsequent idle states.

17 Claims, 7 Drawing Sheets

(56) References Cited

U.S. PATENT DOCUMENTS

2012/0226942 A1    9/2012  Gangasani et al.
2015/0331046 A1*  11/2015  Whetsel ......... G01R 31/318544
                                                            714/727

OTHER PUBLICATIONS

Reimann, F. et al., "Advanced Diagnosis: SBST and BIST Integration in Automotive E/E/ Architectures," 2014 51st IEEE Design Automation Conference (DAC); Jun. 1-5, 2014; ISSN: 0738-100X; 6 pages.

* cited by examiner

BUILT-IN SELF TEST FOR A/D CONVERTER

FIELD OF THE DISCLOSURE

This disclosure relates generally to testing of an integrated circuit, and more particularly, to built-in self-test of analog-to-digital converters.

BACKGROUND

Built-in self-test aids field testing. BIST tests an integrated circuit during normal operation in a product. BIST would be especially helpful for an analog-to-digital converter, which is a necessary component for many products.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION OF THE DRAWINGS

A system having an analog-to-digital converter includes built-in self-test (BIST) circuitry that can verify proper operation of the analog-to-digital converter. In an embodiment, the BIST circuitry can monitor idle states of the analog-to-digital converter, e.g., the time during which an application of the system is not using the converter, and initiating a BIST test when it is determined that an encountered idle state is to be sufficiently long to perform the test BIST test. In another embodiment, the BIST circuitry can save its test state information, allowing the BIST test to be executed over a plurality of idle states, by being interrupted when an application needs use of the analog-to-digital converter. In another embodiment, the BIST circuitry can implement a BIST test by sharing conversion cycles of the analog-to-digital converter with the application by first increasing the number of available conversion cycles. For example, by increasing a clock rate proved to the analog-to-digital converter. The BIST circuitry will be better understood with reference to FIGS. 1-7.

Figure 1:
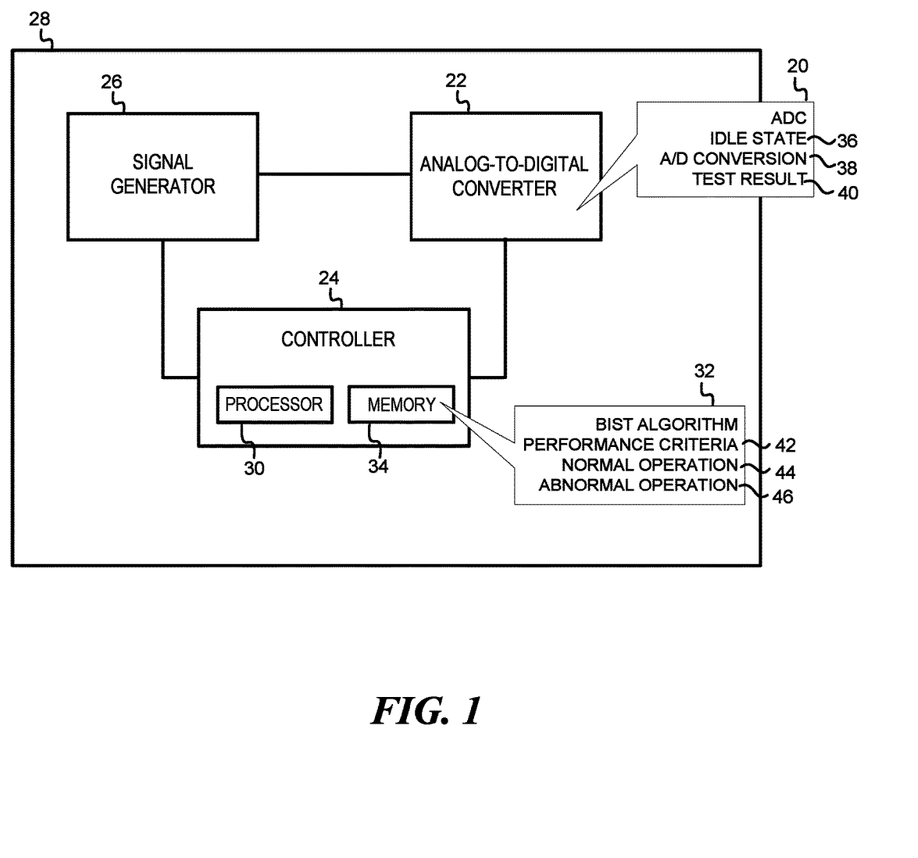
FIG. 1 is a simplified illustration of a built-in self-test (or "BIST") for an analog-to-digital converter, according to exemplary embodiments.

FIG. 1 is a simplified block diagram of a circuit portion 28 of an integrated circuit that includes an analog-to-digital converter 22 and associated BIST circuitry, according to exemplary embodiments. The integrated circuit that includes the portion 28 can be a system on chip (or "SOC") architecture that additionally integrates a data processor, a memory, and the like on a common semiconductor substrate, package substrate, and the like. The circuit portion 28 includes the analog-to-digital converter 22 that implements features 20, and BIST circuitry that itself includes controller 24, and a signal generator 26. The controller 24 implements BIST algorithm 32 and can have a processor 30 that can be a non-programmable state machine, or an instruction based processor and associated memory. By way of example, it is presumed that the processor 30 is an instruction based processor that executes instructions stored at memory 34 to execute the BIST algorithm 32. Though, it will be appreciated, that the operations of the described test algorithm could also be implemented in non-programmable state machine logic. The BIST algorithm 32 controls the processor 30 to perform operations, such as predicting or determining an idle state 36 of the analog-to-digital converter 22. The idle state 36 represents a time during which an analog-to-digital conversion is not being performed by the analog-to-digital converter 22 for an associated application. For example, the idle state can be the result of the analog-to-digital converter having no active or pending conversions, the result of an ongoing conversion having been paused, and the like.

When the controller 24 determines that the analog-to-digital conversion 38 is not needed, by virtue of being in an idle state, the controller 24 can initiate or commence the built-in self-test 20 of the analog-to-digital converter 22. For example, during an idle state 36, controller 24 may send signal generator 26 commands to provide test information to the analog-to-digital converter 22, and commands to the analog-to-digital converter 22 to converting the test information and provide the result to the controller 24 for analysis. Thus, the test algorithm 32 causes the controller 24 to start the signal generator 26 to send the analog test signal, and sends synchronized information to the analog-to-digital converter 22 that instructs the analog-to-digital converter 22 to execute the built-in self-test 20. The controller 24 may then receive a digital test result 40 generated by the analog-to-digital converter 22 during the idle state 36, that is based upon the analog test information provided by the signal generator. The controller 24 then compares the test result 40 to one or more performance criteria 42 (range of values, threshold limits, or other logical statements). If the test result 40 satisfies the performance criteria 42, then the controller 24 can infer a normal operation 44. However, if the test result 40 fails to satisfy the performance criteria 42, then the controller 24 can infer an abnormal operation 46, perhaps indicating a fault or error.

Exemplary embodiments thus present an elegant solution. The analog-to-digital conversion 38 is an important aspect of many applications implemented by electrical systems and integrated circuits (IC), in that the conversion plays a vital role in bridging the analog and digital realms/components. Indeed, as one example, the recent push to autonomous driving puts extremely stringent safety requirements on in-car electronics associated with such an application, which often includes one or more analog-to-digital converters (or "ADCs"). Traditional manufacturing test only ensures the functionality and/or accuracy of the ADCs before being deployed in the field. The inventors envision that in-field testing is highly desirable, especially for safety critical applications, including autonomous driving. The built-in self-test 20 of the analog-to-digital converter 22 thus provides immediate, in-field, real world testing to ensure safe, efficient, and desired performance.

Exemplary embodiments may not disrupt normal application execution, because the analog-to-digital conversion 38 is likely an important operation that should not be interrupted. One of the main issues of in-field testing is the inherent conflict in the time domain between the analog-to-digital converter's normal operation and its testing operation. Exemplary embodiments may thus blend implementation of the built-in self-test 20 with normal operation of the analog-to-digital conversion 38 using time sharing techniques, without disruption of an applications normal operation. That is, exemplary embodiments implement the on-chip built-in self-test 20 with cycle sharing according to various states. Thus, in-field testing of static/dynamic linearity performance, basic functionality, and the like, of the analog-to-digital converter 22 becomes possible during in field testing. Exemplary embodiments are thus applicable to any built-in self-test, as any architecture and test methodology is applicable.

Figure 2:
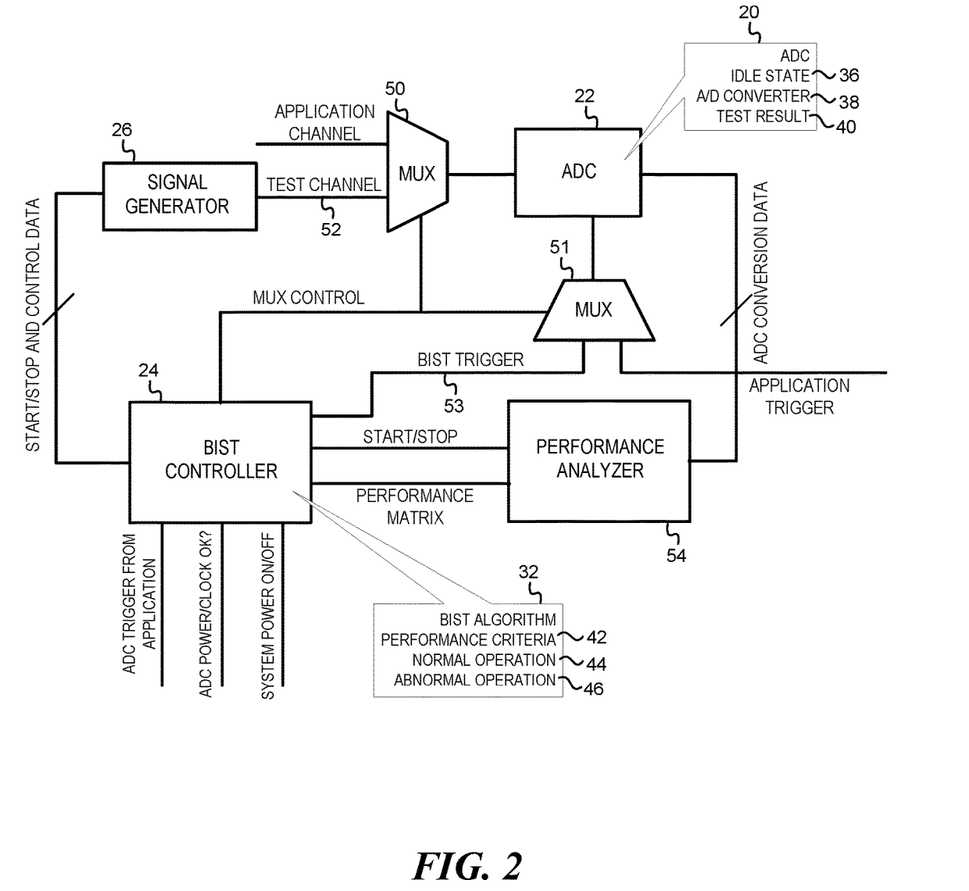
FIG. 2 is a more detailed illustration of the BIST, according to exemplary embodiments.

FIG. 2 is a more detailed illustration of circuit portion 28 of FIG. 1. Here again the controller 24 predicts, infers, or determines when the analog-to-digital conversion 38 is in an idle state, and is, therefore, at least temporarily not needed. For example, the controller 24 can have a priori knowledge of states of the system that includes circuit portion 28 that indicate the presence of a current or up-coming idle state. For example, a signal generated by the application to place the analog-to-digital converter 22 in a low power mode can be known to indicate the application will not need to use the analog-to-digital converter 22 for at least a certain amount of time, during which BIST of the analog-to-digital converter could be performed instead of placing the analog-to-digital converter into a low-power mode. As another example, the analog-to-digital converter can operate in a time multiplexed manner, wherein a portion its clock cycles are dedicated to application processing and a portion of its clock cycles are considered idle states, during which the analog-to-digital converter 22 can be tested. Once the analog-to-digital converter is determined to be in the idle state, the controller 24 can cause the analog-to-digital converter 22 to start the BIST algorithm 32 to test the analog-to-digital converter 22 during the idle state 36. Exemplary embodiments may thus in-field test the analog-to-digital converter 22 with no disruption to its normal operation (e.g., the application based analog-to-digital conversions). The basic functionality and performance (e.g., differential and integral nonlinearity error) may be tested in-field and in-product.

FIG. 2 specifically illustrates the BIST controller 24, the signal generator 26, the analog-to-digital converter 22, input multiplexers 50 & 51, and a performance analyzer 54. The controller 24 serves as the central controller for starting, synchronizing, pausing stopping, and the like, a test sequence of the built-in self-test 20. The controller 24 may thus monitor operational signals of the analog-to-digital converter 22, or other portions of the system that includes the analog-to-digital converter 22 and its associated BIST circuitry, to determine when to start, interrupt, and/or stop the analog-to-digital conversion 38. For example, FIG. 2 illustrates the controller 24 connected to interconnects for receiving indicators labeled "ADC power/clock OK", "System power on/off", and "ADC trigger from application", each of which can be monitored to determine when to implement a self test of the analog-to-digital converter 22.

When test operation starts, the BIST controller 24 configures multiplexers 50 and 51 to communicate information from their respective test channels 52 and 53 to the analog-to-digital converter 22. Thus, instead of receiving analog information from the application circuitry, the analog-to-digital converter 22 receives analog information from the signal generator 26 via test channel 52, labeled TEST CHANNEL, and instead of receiving operational trigger information from the application circuitry, the analog-to-digital converter 22 receives operational triggers from the BIST controller 24 via test channel 52, labeled BIST TRIGGER. For example, BIST controller 24 can provide trigger/control information via test channel 53 to coordinate the conversion process 38 performed by the analog-to-digital converter 22. The BIST controller 24 can also provide control information to the signal generator 26 that initiates generation of an analog test signal that is provided to the test channel 51 for communication to the analog-to digital converter 22. By providing control signals to the performance analyzer 54, labeled START/STOP, the BIST controller 24 enables the performance analyzer 54 to receive and monitor the digital test results 40 from the analog-to-digital converter 22. These test results, e.g., the ADC conversion data based on the analog signal provided from the signal generator 26, are analyzed by the performance analyzer, and the results of the analysis, labeled "performance matrix", can be provided to BIST controller 24. The performance matrix information is compared against the performance criteria 42 to determine whether the analog-to-digital converter is running in normal operation 44 or abnormal operation 46.

Figure 3:
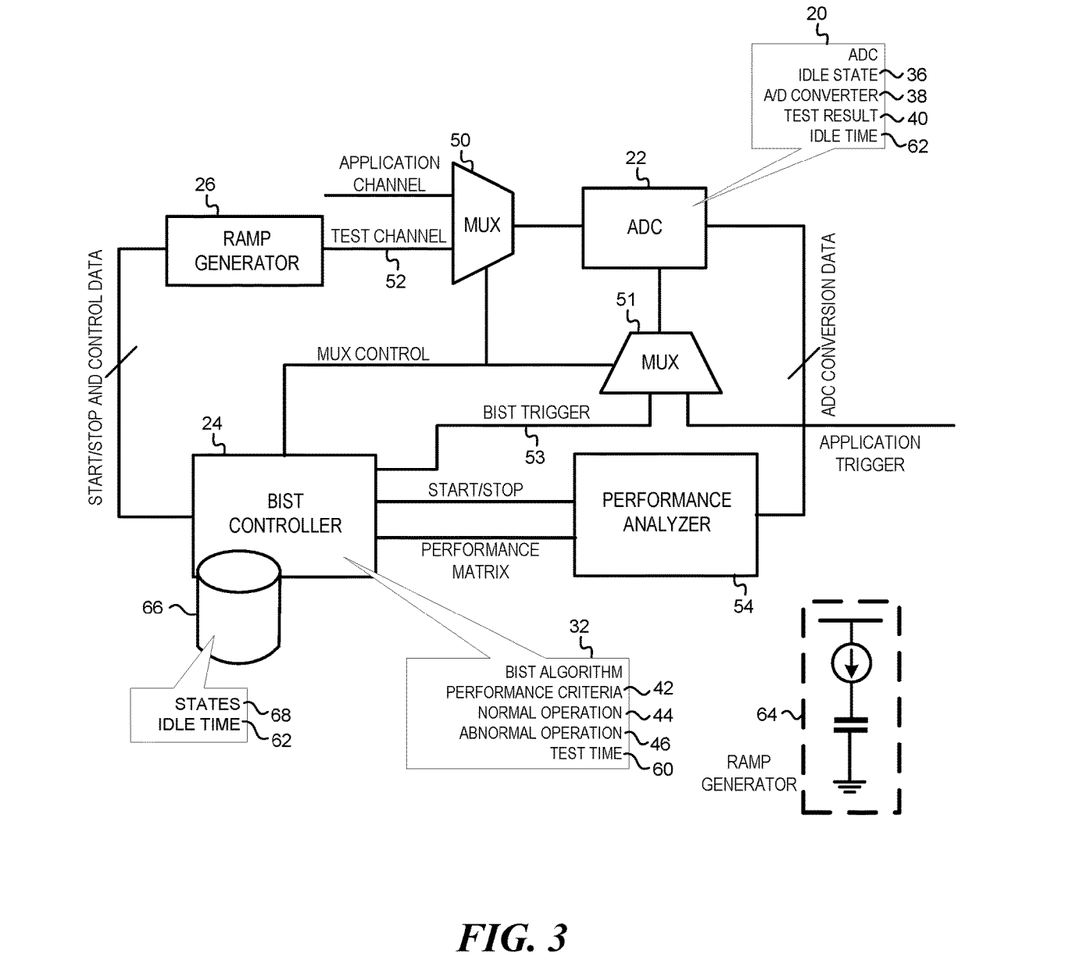
FIGS. 3-4 illustrate an idle state, according to exemplary embodiments.
Figure 4:
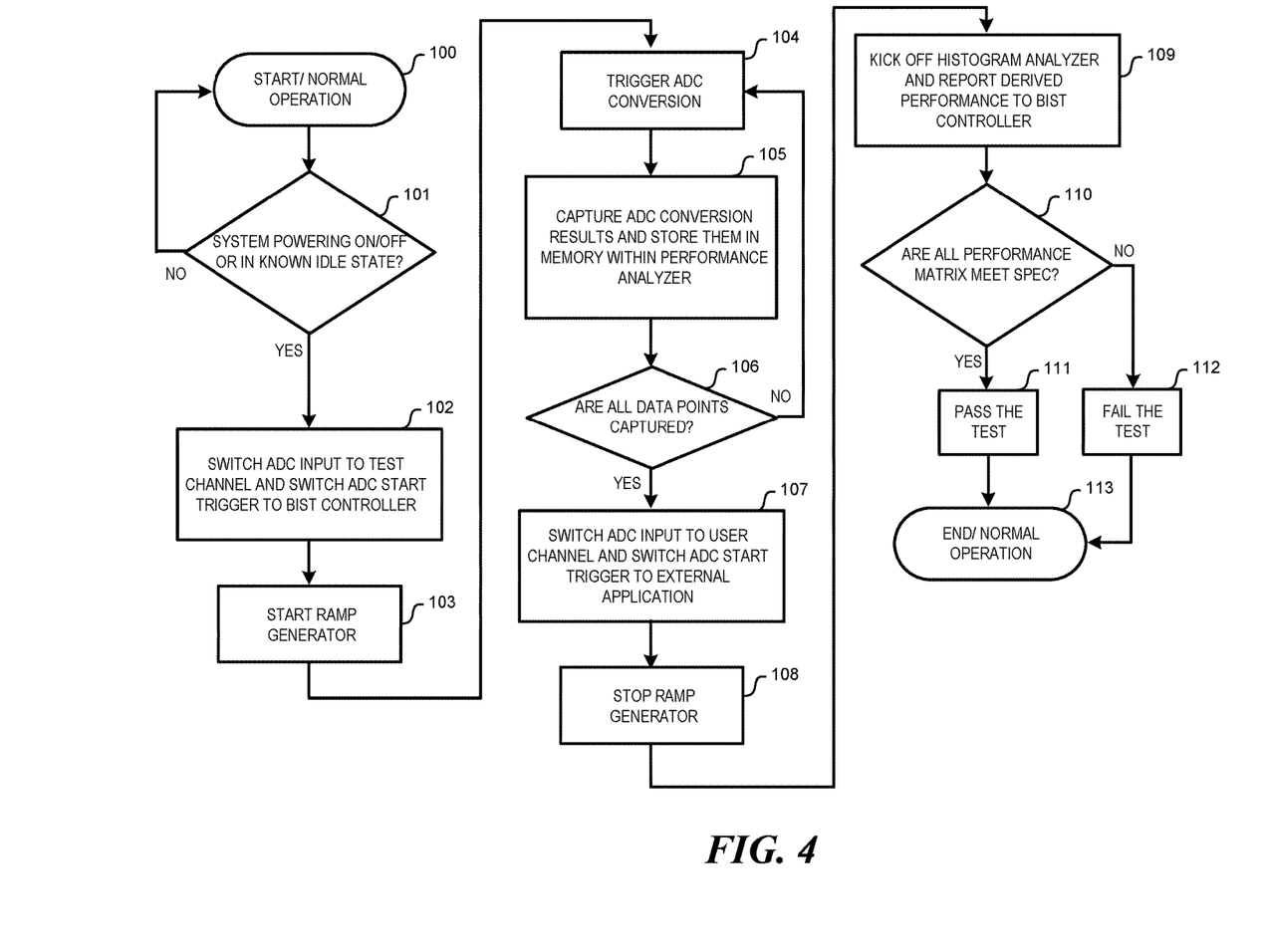

FIGS. 3 and 4 further illustrate BIST testing of the ADC 22 associated with an idle state 36, according to exemplary embodiments. Here, a current or upcoming idle state of the analog-to-digital converter 22 during normal operation is predicted or determined by the BIST controller 24 to have a duration that equals or exceeds the duration of the BIST algorithm 32 executed under control of the BIST controller 24. That is, the BIST algorithm 32 may be completed or executed within the duration of the idle state 36.

FIG. 3 illustrates a circuit schematic, and FIG. 4 illustrates an algorithmic flowchart, for conducting the built-in self-test 20 within the idle state 36. The analog-to-digital converter 11 is known to have a plurality of idle states having various idle times, including an idle state 36 having an idle time 62. Also, the BIST algorithm 32 is known to have a test time of time the indicate how long the BIST test takes to execute. The test time 60 may be determined from a previous, historical performance of the BIST test, or an average of multiple previous runs. Should the controller 24 determine that an idle state is to occur, the idle time if that state can be compared to the test times 60 To determine if the amount of time available is sufficient to form a BIST test. For example, if the idle time 62 of idle state 36 is longer than test time 60, the BIST controller 24 will determine a BIST test can be performed when the idle state 36 is detected. Exemplary embodiments may thus predict or infer that an analog-to-digital conversion of application data is not required in known event(s), based upon state information. When there are sufficient idle times associated with operation of an analog-to-digital converter that exceed the test time 60, there may be no need for the built-in self-test circuitry to be able to remember/hold its state because the analog-to-digital converter 22 needs to perform a conversion for the application; thus simplifying the design.

The signal generator 26 may include a ramp generator 64 that implements an analog ramp signal. Thus, exemplary embodiments may assume a simple ramp generator with sufficient linearity performance as the signal generator 26 and a histogram analysis routine as the performance analyzer 54 to derive the ADC's performance, e.g., differential non-linearity and integral non-linearity. The ramp generator may be implemented by the circuit 64, which uses a current source to charge a capacitor.

Exemplary embodiments can maintain a database 66 indicative of idle times associated with various states of operation of an integrated circuit that includes the analog-to-digital converter 22, and its associated BIST circuitry. Thus, the database 66 of idle times contains or stores entries that electronically associate different states 68, also referred to as events, to different idle times 62. For example, the states 68 may describe power on and power off events for which the event mechanism has a predetermined duration for which the analog-to-digital conversion 38 is idle and not needed. Whenever one of the events 68 is determined to occur, the controller 24 may query the database 66 of idle times for the event 68 and identify the corresponding idle time 62. The controller 24 may then compare the idle time 62 to the test time 60 required to perform the built-in self-test 20. If the idle time 62 equals or exceeds the test time 60, then the controller 24 may have discretion to trigger or start the built-in self-test 20. The operation of the built-in self-test 20 may thus take known clock cycles and if the test time 60 fits within the duration of the event 68, the controller 24 may commence the on-chip built-in self-test 20.

At block 100, of FIG. 4, a method begins. At block 101, it is determined whether the current state is of the system is indicative of the analog-to-digital converter being in an idles state that will be of sufficiently long time during which a built-in self test can be performed. If so, float proceeds to block 102, otherwise flow returns to block 100.

At block 102, test channels used to test analog-to-digital converter are selected. Next at block 103, an analog test signal, such as an analog ramp signal, is provided from test signal circuitry to the analog-to-digital converter, and at block 104, trigger signals are sent to the analog to digital converter to initiate conversion of the test signal. At block 105 as the test analog signal is being converted to digital values, the results are stored in memory within a performance analyzer. This continues, at blocks 104-106, until all data points are captured. At Block 107 the normal application channels are again selected, allowing an external application request conversions by the analog to digital converter 22. At block 108, generation of the test signal is terminated. The captured digital values are analyzed at block 109 by a performance analyzer that provides a performance matrix based upon the results. At block 110 the performance matrix is compared to a performance criteria to determine whether the analog-to-digital converter is operating normally, or not normally. If it is determined that the analog-to-digital converter is operating normally, flow proceeds to block 111, and normal operation resumes. Otherwise, if it is determined at block 110 that the analog-to-digital converter is not operating normally, flow proceeds to block 112 where a failure indicated is generated, allowing remedial action to be taken.

Figure 5:
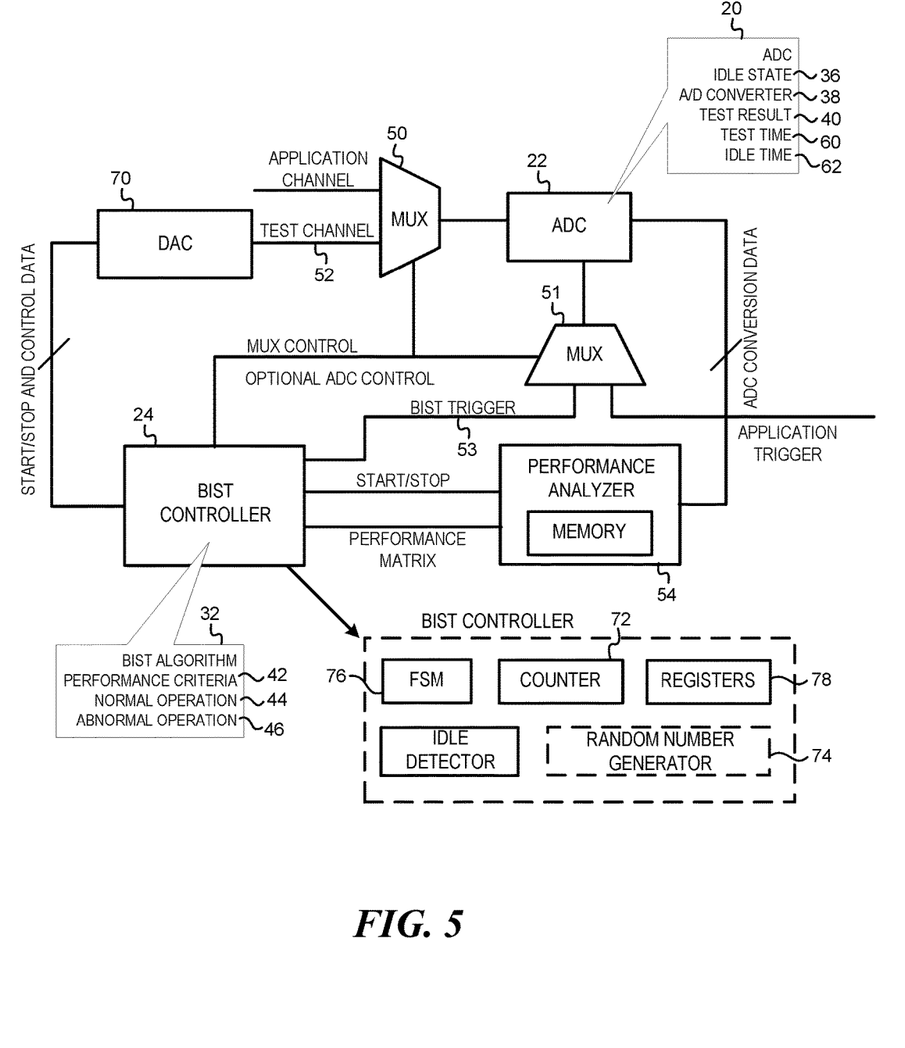
FIGS. 5-6 illustrate a common testing scenario, according to exemplary embodiments.
Figure 6:
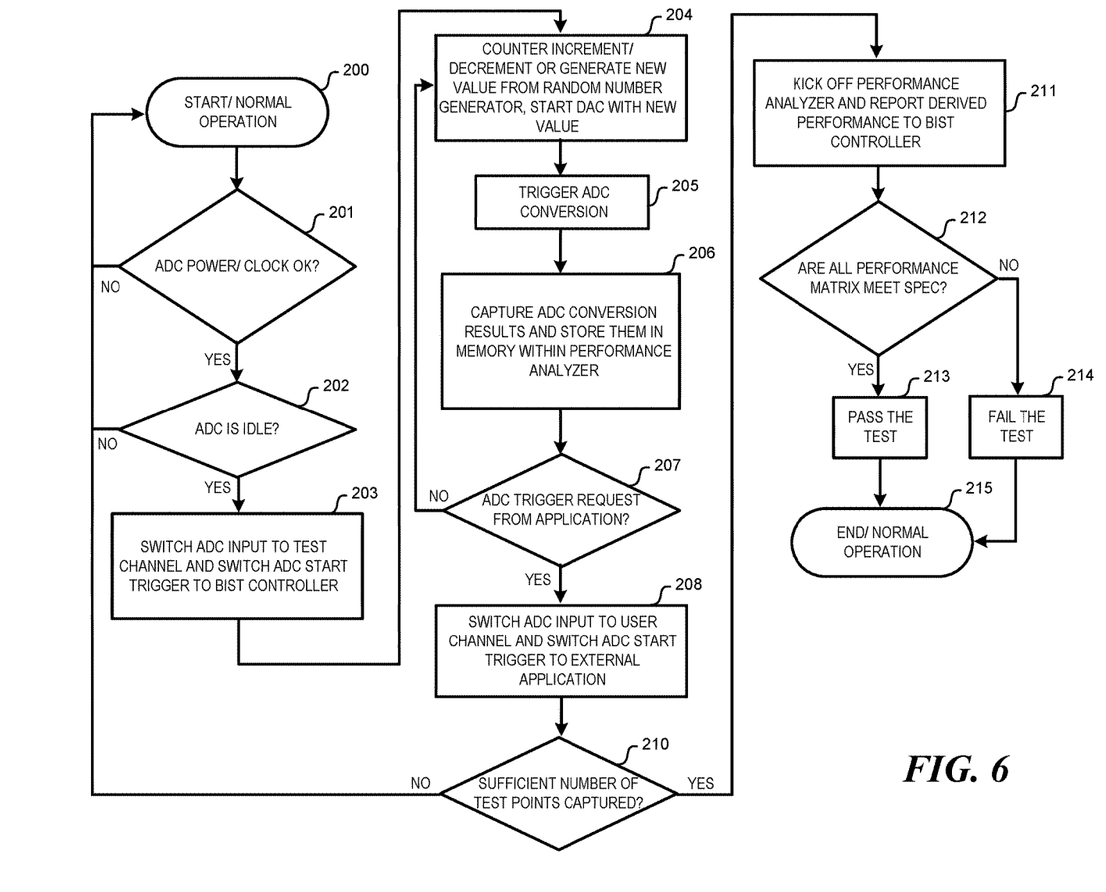

FIGS. 5-6 illustrate another testing scenario according to exemplary embodiments. Here the idle time 62 may be unknown, for whatever reason, or is known to be too short to perform the BIST algorithm 32. In other words, there is a possible or even probable chance that the test time 60 needed to completely conduct the built-in self-test 20 will exceed the idle time 62. Even though the analog-to-digital conversion 38 normally performed by the analog-to-digital converter 22 may not be continually required, the idle time 62 may be unknown, indeterminable, or even shorter that the test time 60 for completing the entire built-in self-test 20. FIG. 5 illustrates a circuit schematic, and FIG. 6 illustrates an algorithmic flowchart, for pausing/interrupting and resuming the built-in self-test 20 between idle states. As such, during the idle period, any request from the normal application to bring the analog-to-digital converter 22 back online may not be deterministic. Quick response to the triggering request(s) is likely needed as it determines the latency of the analog-to-digital converter 22. Here, then, the controller 24 may instruct the analog-to-digital converter 22 to pause the built-in self-test 20 when the analog-to-digital conversion 38 must perform a conversion for an application. The controller 24 may then instruct the analog-to-digital converter 22 to resume the built-in self-test 20 when the analog-to-digital conversion 38 is not required and another idle state 36 subsequently resumes.

Exemplary embodiments may thus pause the BIST algorithm 34 whenever the BIST controller 24 determines that an application analog-to-digital conversion must be performed. Exemplary embodiments may implement the signal generator 26 to be independent of time and deterministic based on digital control words provided by the BIST controller 24. Moreover, the performance analyzer 54 may have its own memory to store/hold states or data associated with the built-in self-test and delay performance analysis until a sufficient number of data points are captured. The controller 24 may thus continually or periodically listen or monitor for a status of the analog-to-digital converter 22 and insert one or more test cycles when the analog-to-digital converter 22 enters the idle state 36. The controller 24 may then release remote control of the analog-to-digital converter 22 when the analog-to-digital conversion 38 is requested to resume (e.g., normal operation). The performance analyzer 54 and/or the controller 24 may thus store test data and process the test data once a sufficient number of samples are captured.

Exemplary embodiments may call or invoke a digital-to-analog converter 70 as a signal source, instead of a time-dependent ramp function 64 illustrated with reference to FIGS. 3-4. The digital-to-analog converter 70 may have its voltage output solely dependent on digital control words. The performance analyzer 54 and/or the controller 24 may thus store raw or processed test data. The controller 24, for example, may hold data between test conversions that is to be provided to the digital-to-analog converter 70 for conversion to an analog signal. The controller 24 may thus monitor the operation of the analog-to-digital converter 22 and detect the idle state 36 (when the analog-to-digital conversion 38 pauses or stops). The controller 24, for example, may monitor, receive, or inspect for an ADC trigger signal from a software application. The controller 24 may also have a counter 72 and/or pseudo random number generator 74 to generate digital values that are provided to the digital-to-analog converter 70 for conversion. A finite state machine (or "FSM") 76 and registers 78 may implement the execution sequence of digital values as discussed with reference to the method of FIG. 6.

At block 200, of FIG. 6, a method begins. At block 201, it is determined that the ADC is powered, and that a clock used by the ADC is operational. If so, flow proceeds to block 202, otherwise flow returns to block 200. At block 202, it is determined by the BIST controller whether the analog to digital converter is in, or about to enter, an idles state. Thus, according to exemplary embodiments the BIST controller can listen to the analog-to-digital converter 22 to find idle cycles. When an idle cycle is detected, flow proceeds to block 203, otherwise flow proceed to block 200.

At block 203, the BIST controller 24 can assert control over the analog-to-digital converter 22 and switch an ADC input channel to receive an analog input from the digital-to-analog converter 70 via a test channel. At block 204, the BIST controller 24 initiates a counter 72 or random number generator 74 to an initial value that is provided to a digital-to-analog converter 70 along with appropriate control signals. The digital-to-analog converter then generates a corresponding analog signal. The analog signal is provided to the analog-to-digital converter via the test channel 52. At block 205, the BIST controller 24 provides appropriate BIST trigger signals to the analog-to-digital converter 22 needed to convert the analog signal back into a digital signal. At block 206, the converted digital signal is captured and stored by the performance analyzer 54. At block 207, the BIST controller 24 determines whether the analog-to-digital converter is needed by the application. If not, flow returns to block 204. Otherwise, flow proceeds to block 208, where the analog-to-digital converter 22 is switched back to normal application mode, allowing an analog signal from the application to be processed. Next, at block 210, it is determined whether a sufficient number of test points have been capture by the performance analyzer to analyze operation of the analog-to-digital converter 22. If not, flow returns to block 200, otherwise, flow proceeds to block 211.

At block 211, the captured digital values are analyzed by the performance analyzer 54, which then provides a performance matrix to the BIST controller 24 based upon the captured results. At block 212 the performance matrix is compared to a performance criteria to determine whether the analog-to-digital converter 22 is operating normally, or not normally. If it is determined that the analog-to-digital converter is operating normally, flow proceeds to block 213 where an appropriate indicator is generated, and normal operation resumes. Otherwise, if it is determined at block 212 that the analog-to-digital converter 22 is not operating normally, flow proceeds to block 214 where a failure indicated is generated, allowing the system to take remedial action.

Thus, the digital-to-analog converter 70 generates a test signal to be sampled by the analog-to-digital converter 22. Any analog-to-digital conversion data may then be sent to the performance analyzer 54 to derive a performance. Once there is a request by the application to use the analog-to-digital converter 22, e.g., for normal processing, e.g., the controller 24 relinquishes control to the application and switches the ADC input channel to a user channel as soon as possible. It will be appreciated that in an embodiment, the information received over the user channel is received from a source that is not integrated onto the same semiconductor substrates as the built-in self-test circuitry, while the information received from the built-in self-test signal generator is integrated onto a common semiconductor substrate as the analog-to-digital converter. In an embodiment, the current state of the built-in self-test is saved, and resumed during a next available idle time. In another embodiment, the current test information is not saved, and the built-in self-test will need to be restarted. The switching back to normal application operation might incur some delay between the initiation of ADC conversion from application and when the data is available for application. However, this delay will be considered as ADC latency when ADC being woke up from test mode.

Figure 7:
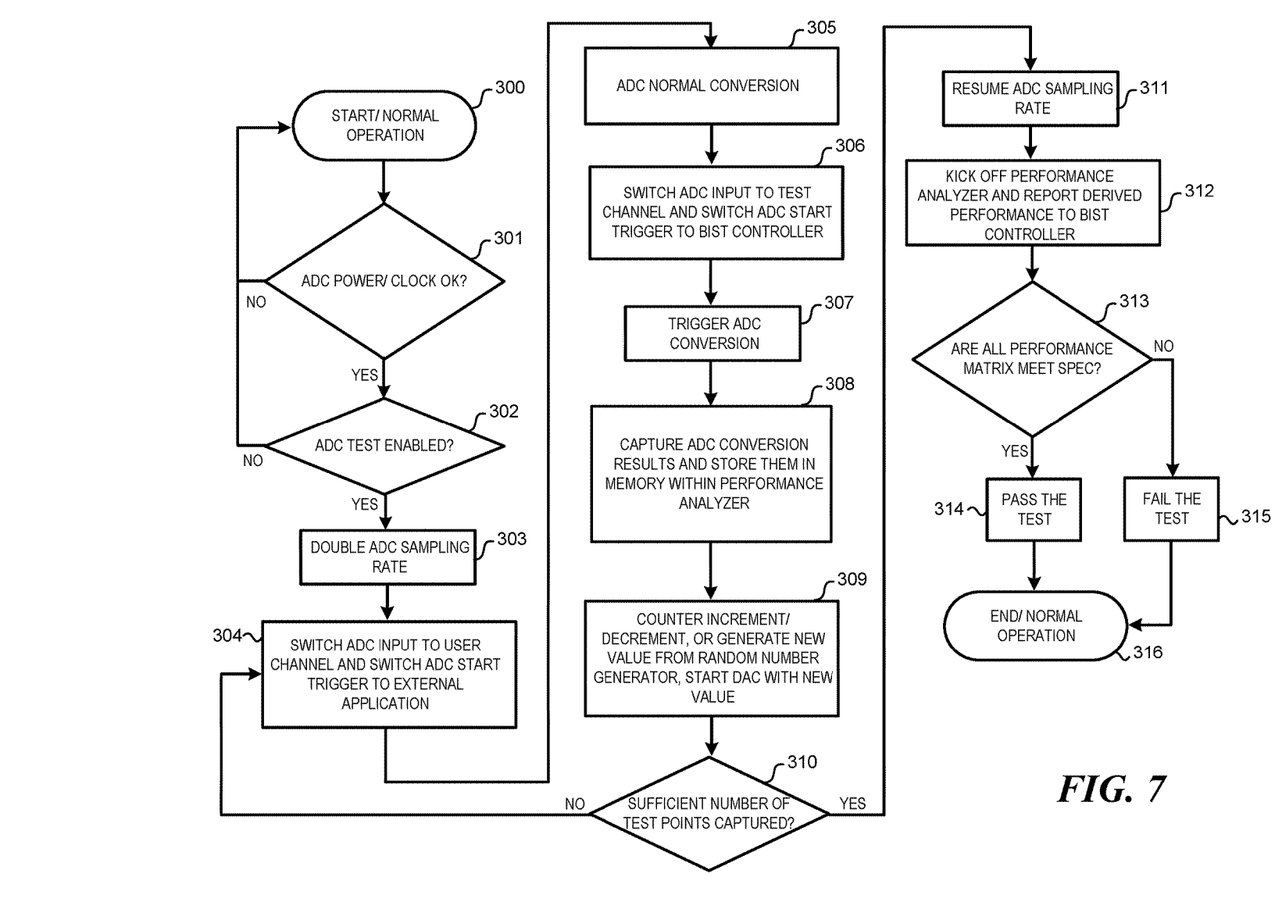
FIG. 7 is a flowchart illustrating a testing scenario, according to exemplary embodiments.

FIG. 7 is a flowchart illustrating a BIST test scenario for a system that time multiplexes the analog-to-digital converter between normal application mode and BIST mode. The embodiment of FIG. 7 can facilitate BIST testing during an ongoing analog-to-digital conversion of the application. For example, the BIST test can be implemented when a continuously received analog signal is provided by the application to the analog-to-digital converter for conversion. This can be accomplished by, at least temporarily, using a higher analog-to-digital conversion rate.

At block 300, of FIG. 7, a method begins. At block 301, it is determined that the ADC is powered, and that a clock used by the ADC is operational as expected. If so, flow proceeds to block 302, otherwise flow returns to block 300. At block 302, it is determined by the BIST controller whether the analog-to-digital converter is to be tested. If so, flow proceeds to block 303, otherwise, flow returns to block 300.

At block 303, a normal clock of the analog-to-digital converter that is used when a BIST test is not being performed is increased to increase the number of conversions than can be performed by the analog-to-digital converter. By way of example, it is presumed the clock rate is doubled. At block 304, the switches that determine whether application or BIST information is converted by the analog-to-digital converter are set to allow control and conversion by the application. At block 305, an analog-to-digital conversion of application data occurs for one or more conversion periods, and the results are returned to the application. For ease of discussion, it is presumed that the application and BIST test split the available conversion cycles evenly.

At block 306, the switches that determine whether application or BIST information is converted by the analog-to-digital converter are set to allow the conversion of BIST test data, and a first analog value of a known sequence of analog values are provided to the analog-to-digital converter for conversation under the control of the BIST controller. At block 307, the BIST controller provides appropriate BIST trigger signals to the analog-to-digital converter needed to convert the analog signal back into a digital signal. At block 308, the converted digital signal is captured and stored by the performance analyzer 54. At block 309, the BIST controller updates a count or random number that is used to determine a next in sequence analog value to be provided to the analog-to-digital converter during BIST testing. At block 310, it is determined whether a sufficient number of test points have been capture by the performance analyzer to analyze operation of the analog-to-digital converter. If not, flow returns to block 304, otherwise, flow proceeds to block 311. At block 311, the increased clock rate is reduced to the normal clock rate, as additional capture cycles are no longer needed. Operation of blocks 312-316 correspond to blocks 211-215, respectively.

In a first aspect, the method can include determining a first idle state of an analog-to-digital converter during normal operation, initiating a built-in self-test operation to test the analog-to-digital converter during the first idle state, providing built-in self-test test data to the analog-to-digital converter during the first idle state in response to the initiating of the built-in self-test operation, and analyzing a test result produced by the analog-to-digital converter based on the test data. In one embodiment of the first aspect, analyzing the test results includes determining the analog-to-digital converter passed the built-in self-test operation based on the test result matching an expected test result. In another embodiment of the first aspect, analyzing the test results includes determining the analog-to-digital converter failed the built-in self-test operation based on the test result not matching a test result.

In a further embodiment, the first aspect includes determining a second idle state of the analog-to-digital converter during normal operation, initiating a built-in self-test operation to test the analog-to-digital converter during the second idle state, and interrupting the built-in self-test operation, prior to completing the test operation, in response to a resumption of the analog-to-digital conversion performed by the analog-to-digital converter during normal operation. In a more particular embodiment, the first aspect includes saving a state of the built-in self-test operation in response to the interrupting of the built-in self-test operation. In an even more particular embodiment, the first aspect includes comprising resuming the built-in self-test operation of the analog-to-digital converter after saving the state. In another more particular embodiment, the first aspect includes aborting the built-in self-test operation in response to the interrupting of the built-in self-test operation.

In a second aspect, a method can include determining, at a first time, an idle state in analog-to-digital conversion performed by an analog-to-digital converter, determining a test time for a built-in self-test operation of the analog-to-digital converter in response to the idle state in the analog-to-digital conversion, determining an idle time of the idle state in the analog-to-digital conversion performed by the analog-to-digital converter, initiating the built-in self-test operation of the analog-to-digital converter in response to the idle time at least equaling the test time, providing built-in self-test test data to the analog-to-digital converter in response to the initiating of the built-in self-test operation, and analyzing a test result produced by the analog-to-digital converter based on the test data.

In one embodiment, the second aspect further includes determining the analog-to-digital converter passed the built-in self-test operation based on the test result. In another embodiment, the second aspect further includes determining the analog-to-digital converter failed the built-in self-test operation based on the test result. In a further embodiment, the second aspect further includes interrupting the built-in self-test operation of the analog-to-digital converter after initiating the built-in self-test. In a more particular embodiment, the further embodiment includes saving a state of the built-in self-test operation in response to the interrupting. In another more particular embodiment, the further embodiment further includes resuming the built-in self-test operation of the analog-to-digital converter after the interrupting. In a further more particular embodiment, the further embodiment further includes aborting the built-in self-test operation in response to the interrupting of the built-in self-test operation.

In a third aspect, a device can include an analog-to-digital converter at a substrate, built-in self-test state detection circuitry at the substrate configured to determine an idle state in analog-to-digital conversion performed by the analog-to-digital converter, a built-in self-test controller circuitry configured to initiate a built-in self-test operation by the device of the analog-to-digital converter in response to the built-in self-test detection circuitry determining the occurrence of the idle state, a built-in self-test signal generator circuitry configured to provide an analog test signal to the analog-to-digital converter in response to the built-in self-test controller circuitry initiating the built-in self-test operation, and a built-in self-test performance circuitry configured to analyze a test result produced by the analog-to-digital converter. In one embodiment of the third aspect, the built-in self-test controller circuitry is further configured to determine that the analog-to-digital converter passed the built-in self-test operation based on the test result. In another embodiment of the third aspect, the built-in self-test controller circuitry further configured to determine that the analog-to-digital converter failed the built-in self-test operation based on the test result. In a further embodiment of the third aspect, the built-in self-test controller circuitry is further configured to determine that an idle time of the idle state exceeds a test time of the built-in self-test operation prior to initiating the built-in self-test operation. In yet a further embodiment of the third aspect, the built-in self-test controller circuitry is further configured to interrupt the built-in self-test operation in response to a resumption of the analog-to-digital conversion performed by the analog-to-digital converter during normal operation. In a more particular embodiment of the yet a further embodiment, the built-in self-test controller circuitry is to complete the built-in self-test operation of the analog-to-digital converter within the idle time.

A fourth aspect, a method includes determining that a BIST test of an analog-to-digital converter is to be performed, increasing a conversion rate of the analog-to-digital converter in response to determining the BIST is to be performed, converting BIST test data at the analog-to-digital converter during a portion of the available conversion cycles at the increased rate, and converting application data at the analog-to-digital converter during a second portion of the available conversion cycles at the increased rate.

The preceding description in combination with the Figures was provided to assist in understanding the teachings disclosed herein. The discussion focused on specific implementations and embodiments of the teachings. This focus was provided to assist in describing the teachings, and should not be interpreted as a limitation on the scope or applicability of the teachings. However, other teachings can certainly be used in this application. The teachings can also be used in other applications, and with several different types of architectures. For example, in another embodiment, a BIST controller that needs to complete a BIST test in its entirety, without being interrupted, can initiation a BIST test, as needed, when a new interrupt cycle is detected, even though it may not be known whether the interrupt will last a sufficiently long time. In the event an application needs access to the analog-to-digital converter, the ongoing BIST test can be aborted, with all results lost. The BIST test can then be initiated again in response to a next idle state being detected, and repeated until a sufficiently long idle time is encountered.

In this document, relational terms such as "first" and "second", and the like, may be used solely to distinguish one entity or action from another entity or action without necessarily requiring or implying any actual such relationship or order between such entities or actions. The terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

Note that not all of the activities or elements described above in the general description are required, that a portion of a specific activity or device may not be required, and that one or more further activities may be performed, or elements included, in addition to those described. Still further, the order in which activities are listed is not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A method, comprising:
   determining a first idle state of an analog-to-digital converter during normal operation;
   initiating a built-in self-test operation to test the analog-to-digital converter during the first idle state;
   providing built-in self-test test data to the analog-to-digital converter during the first idle state in response to the initiating of the built-in self-test operation;
   analyzing a test result produced by the analog-to-digital converter based on the test data;
   determining a second idle state of the analog-to-digital converter during normal operation;
   initiating a second built-in self-test operation to test the analog-to-digital converter during the second idle state; and
   interrupting the second built-in self-test operation, prior to completing the second built-in self-test operation, in response to a resumption of an analog-to-digital conversion performed by the analog-to-digital converter during normal operation.

2. The method of claim 1, wherein analyzing the test results includes determining the analog-to-digital converter passed the built-in self-test operation based on the test result matching an expected test result.

3. The method of claim 1, wherein analyzing the test results includes determining the analog-to-digital converter failed the built-in self-test operation based on the test result not matching an expected test result.

4. The method of claim 1, further comprising saving a state of the second built-in self-test operation in response to the interrupting of the second built-in self-test operation.

5. The method of claim 4, further comprising resuming the second built-in self-test operation of the analog-to-digital converter after saving the state.

6. The method of claim 1, further comprising aborting the second built-in self-test operation in response to the interrupting of the second built-in self-test operation.

7. A method, comprising:
   determining, at a first time, an idle state in analog-to-digital conversion performed by an analog-to-digital converter during normal operation;
   determining a test time for a built-in self-test operation of the analog-to-digital converter in response to the idle state in the analog-to-digital conversion;
   determining an idle time of the idle state in the analog-to-digital conversion performed by the analog-to-digital converter;
   initiating the built-in self-test operation of the analog-to-digital converter in response to the idle time at least equaling the test time;
   providing built-in self-test test data to the analog-to-digital converter in response to the initiating of the built-in self-test operation;
   analyzing a test result produced by the analog-to-digital converter based on the test data;
   determining at a second time, a second idle state in analog-to-digital conversion performed by an analog-to-digital converter during normal operation;
   initiating a second built-in self-test operation to test the analog-to-digital converter during the second idle state; and
   interrupting the second built-in self-test operation, prior to completing the second built-in self-test operation, in response to a resumption of an analog-to-digital conversion performed by the analog-to-digital converter during normal operation.

8. The method of claim 7, further comprising determining the analog-to-digital converter passed the built-in self-test operation based on the test result.

9. The method of claim 7, further comprising determining the analog-to-digital converter failed the built-in self-test operation based on the test result.

10. The method of claim 7, further comprising saving a state of the second built-in self-test operation in response to the interrupting.

11. The method of claim 7, further comprising resuming the second built-in self-test operation of the analog-to-digital converter after the interrupting.

12. The method of claim 7, further comprising aborting the second built-in self-test operation in response to the interrupting of the built-in self-test operation.

13. A device, comprising:
    an analog-to-digital converter at a substrate;
    built-in self-test state detection circuitry at the substrate configured to determine an idle state in analog-to-digital conversion performed by the analog-to-digital converter during normal operation;
    a built-in self-test controller circuitry configured to initiate a built-in self-test operation by the device of the analog-to-digital converter in response to the built-in self-test detection circuitry determining the occurrence of the idle state;
    a built-in self-test signal generator circuitry configured to provide an analog test signal to the analog-to-digital converter in response to the built-in self-test controller circuitry initiating the built-in self-test operation;
    a built-in self-test performance circuitry configured to analyze a test result produced by the analog-to-digital converter
    wherein the built-in self-test controller circuitry is further configured to interrupt the built-in self-test operation, prior to completing the built-in self-test operation, in response to a resumption of an analog-to-digital conversion performed by the analog-to-digital converter during normal operation.

14. The device of claim 13, wherein the built-in self-test controller circuitry further configured to determine that the analog-to-digital converter passed the built-in self-test operation based on the test result.

15. The device of claim 13, wherein the built-in self-test controller circuitry further configured to determine that the analog-to-digital converter failed the built-in self-test operation based on the test result.

16. The device of claim 13, wherein the built-in self-test controller circuitry is further configured to determine that an idle time of the idle state exceeds a test time of the built-in self-test operation prior to initiating the built-in self-test operation.

17. The device of claim 13, wherein the built-in self-test controller circuitry is to complete the built-in self-test operation of the analog-to-digital converter within the idle time.

* * * * *